(12) United States Patent
Yoshikawa et al.

(10) Patent No.: US 9,810,792 B2
(45) Date of Patent: Nov. 7, 2017

(54) CRYSTAL MATERIAL, RADIATION DETECTOR, IMAGING APPARATUS, NONDESTRUCTIVE INSPECTION APPARATUS, AND LIGHTING APPARATUS

(71) Applicant: TOHOKU UNIVERSITY, Miyagi (JP)

(72) Inventors: Akira Yoshikawa, Miyagi (JP); Shunsuke Kurosawa, Miyagi (JP); Yuui Yokota, Miyagi (JP); Yasuhiro Shoji, Miyagi (JP); Akira Suzuki, Miyagi (JP); Toetsu Shishido, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/655,666

(22) PCT Filed: Dec. 26, 2013

(86) PCT No.: PCT/JP2013/084980
§ 371 (c)(1),
(2) Date: Jun. 25, 2015

(87) PCT Pub. No.: WO2014/104238
PCT Pub. Date: Jul. 3, 2014

(65) Prior Publication Data
US 2015/0346360 A1  Dec. 3, 2015

(30) Foreign Application Priority Data
Dec. 26, 2012 (JP) .................. 2012-283465

(51) Int. Cl.
*G01T 1/20* (2006.01)
*G01T 1/202* (2006.01)
(Continued)

(52) U.S. Cl.
CPC ........ *G01T 1/2023* (2013.01); *C09K 11/7769* (2013.01); *C09K 11/7774* (2013.01);
(Continued)

(58) Field of Classification Search
CPC .................................................. G01T 1/2023
See application file for complete search history.

(56) References Cited

U.S. PATENT DOCUMENTS 6,437,336 B1   8/2002  Pauwels et al.
7,122,129 B2   10/2006 Yagi et al.
(Continued)

FOREIGN PATENT DOCUMENTS

JP  57-131278 A   8/1982
JP  2009-74039 A  4/2009
(Continued)

OTHER PUBLICATIONS

International Preliminary Report on Patentability PCT/JP2013/084980 dated Mar. 9, 2015 with English translation.
(Continued)

*Primary Examiner* — Edwin Gunberg
(74) *Attorney, Agent, or Firm* — McDermott Will & Emery LLP

(57) ABSTRACT

A crystal material represented by a general formula (1):

$$(Gd_{1-x-y-z}La_xME_yRE_z)_2MM_2O_7 \quad (1),$$

where ME is at least one selected from Y, Yb, Sc, and Lu; RE is Ce or Pr; MM is at least one selected from Si and Ge; and ranges of x, y, and z are represented by the following (i):
(i) $0.0 \le x+y+z<1.0$, $0.05 \le x+z<1.0$, $0.0 \le y<1.0$, and $0.0001 \le z<0.05$ (where, when RE is Ce, $y=0$ is an exception).

13 Claims, 11 Drawing Sheets

(51) Int. Cl.

| | | |
|---|---|---|
| *C09K 11/77* | (2006.01) | |
| *C30B 29/32* | (2006.01) | |
| *C30B 29/34* | (2006.01) | |
| *G21K 4/00* | (2006.01) | |
| *C30B 13/00* | (2006.01) | |
| *C30B 15/00* | (2006.01) | |
| *C30B 29/22* | (2006.01) | |

(52) U.S. Cl.
CPC .......... *C09K 11/7775* (2013.01); *C30B 13/00* (2013.01); *C30B 15/00* (2013.01); *C30B 29/22* (2013.01); *C30B 29/32* (2013.01); *C30B 29/34* (2013.01); *G21K 4/00* (2013.01)

(56) References Cited

U.S. PATENT DOCUMENTS

| | | |
|---|---|---|
| 8,197,711 B2 | 6/2012 | Peuchert et al. |
| 2013/0146775 A1* | 6/2013 | Ramsden .................. G01T 3/06 250/362 |
| 2013/0327986 A1* | 12/2013 | Blahuta .............. C09K 11/7774 252/301.4 S |

FOREIGN PATENT DOCUMENTS

| | | |
|---|---|---|
| JP | 2010-235433 A | 10/2010 |
| WO | 03/083010 A1 | 10/2003 |
| WO | 2011/148276 A2 | 12/2011 |

OTHER PUBLICATIONS

Mamoru Kitaura et al., "Quantum material design of new type germinate scintillator crystals based on electronic structure calculations", Department of Physics, Faculty of Science, Yamagata University, Yamagata 990-8560 Institute for Materials Research Tohoku University, Sendai 980-8577, pp. 82-83, with English Abstract.

International Search Report PCT/JP2013/084980 dated Mar. 25, 2014 with English translation.

S. Kawamura et al., "Floating zone growth and scintillation characteristics of cerium-doped gadolinium pyrosilicate single crystals", 2006 IEEE Nuclear Science Symposium Conference Record, San Diego, CA., Oct. 29-Nov. 5, 2006, pp. 1160-1163.

Sohan Kawamura et al., "Phase Relations around the Pyrosilicate Phase in the Gd2O3—Ce2O3—SiO2 System", Crystal Growth & Design, 2009, vol. 9, No. 3, pp. 1470-1473.

Shunsuke Kurosawa et al., "Temperature dependence of the scintillation properties of Ce:GSO and Ce:GSOZ", Nuclear Instruments and Methods in Physics Research A, 690 (2012) pp. 53-57.

Supplementary European Search Report EP Application No. 13869111.8 dated Jul. 7, 2016.

Akira Suzuki et al., "Fast and High-Energy-Resolution Oxide Scintillator: Ce-Doped (La,Gd)2Si2O7", Applied Physics Express, vol. 5, No. 10, Oct. 2012, pp. 102601-1-102601-3.

I. Gerasymov et al., "Growth of bulk gadolinium pyrosilicate single crystals for scintillators", Journal of Crystal Growth 318 (2011) pp. 805-808.

\* cited by examiner

CRYSTAL MATERIAL, RADIATION DETECTOR, IMAGING APPARATUS, NONDESTRUCTIVE INSPECTION APPARATUS, AND LIGHTING APPARATUS

CROSS-REFERENCE TO RELATED APPLICATIONS

This Application is the U.S. National Phase of PCT/JP2013/084980 filed Dec. 26, 2013, which claims priority from Japanese Patent Application No. 2012-283465 filed Dec. 26, 2012. The subject matter of each is incorporated herein by reference in entirety.

FIELD

The present invention relates to a crystal material, a radiation detector, an imaging apparatus, a nondestructive inspection apparatus, and a lighting apparatus.

BACKGROUND

Scintillator single crystals are used for radiation detectors that detect gamma rays, X rays, alpha rays, neutron rays, or the like. Such radiation detectors are widely used for medical imaging apparatuses (imaging apparatuses) such as positron emission tomography (PET) apparatuses and X-ray CT apparatuses, various radiation measuring apparatuses in the field of high-energy physics, resource exploration apparatuses (resource exploration such as oil well logging), or the like.

A radiation detector generally includes a scintillator that absorbs gamma rays, X rays, alpha rays, or neutron rays and converts the rays into scintillation light and a photodetector such as a light-receiving element that receives the scintillation light and converts the scintillation light into an electric signal or the like. In high-energy physics or positron emission tomographic (PET) imaging systems, for example, images are created based on interaction between the scintillator and radiation generated through radioactive decay. In positron emission tomographic (PET) imaging systems, gamma rays generated through interaction between positrons and corresponding electrons within a subject enter the scintillator and are converted into photons, which can be detected by a photodetector. The photons emitted from the scintillator can be detected using photodiodes (PDs), silicon photomultipliers (Si-PMs), photomultiplier tubes (PMTs), or other photodetectors.

The PMT has a high quantum yield (efficiency about converting photons into electrons (a current signal)) in the wavelength range of about 400 nm and is used in combination with a scintillator having a peak emission wavelength of mainly about 400 nm. For a scintillator array, in which scintillators are arranged in an array, a position sensitive PMT (PS-PMT) or the like is used in combination. With this configuration, it can be determined which pixel of the scintillator array has detected a photon from gravity computation.

Semiconductor photodetectors such as photodiodes (PDs), avalanche photodiodes (APDs), and silicon photomultipliers (Si-PMT) have wide applications in radiation detectors and imaging devices in particular. Various semiconductor photodetectors are known. Some APDs formed of silicon semiconductors, for example, have a quantum efficiency of 50% or more in the wavelength band of from 350 nm to 900 nm and have higher quantum efficiency than PMTs, the quantum efficiency of which is 45% at most. In the above wavelength band, the sensitivity is higher in the wavelength band of from 500 nm to 700 nm and peaks at around 600 nm, in which the quantum efficiency is about 80%. Given these circumstances, these semiconductor photodetectors are used in combination with scintillators having a peak emission wavelength in the range of from 350 nm to 900 nm, centering at around 600 nm. Similarly to PMTs, also for PDs, APDs, and Si-PMs, there exist PD arrays having position detection sensitivity, position sensitive avalanche photodiodes (PSAPD), and Si-PM arrays. These elements can also determine which pixel of the scintillator array has detected a photon. Furthermore, even for short-wavelength light emission scintillators of 350 nm or less, scintillator light is converted into light with a wavelength range in which silicon semiconductors have sensitivity by, for example, using wavelength conversion elements, thereby achieving radiation detectors that perform reading by silicon semiconductors.

The scintillator adapted for these radiation detectors is desired to have high density and a large atomic number (a high photoelectric absorption ratio) in view of detection efficiency, a large light emission amount in view of high energy resolution, and a short fluorescence lifetime (fluorescence decay time) in view of the necessity of high-speed response. In addition, in recent years' systems, many scintillators are required to be densely arranged in a long, narrow shape (about 5 mm×30 mm for PET, for example) for the purpose of achieving a multilayered structure and increased resolution, and important selection factors include handleability, processability, capability of producing large crystals, and a price. It is also important that the light emission wavelength of the scintillators matches the wavelength range with high detection sensitivity of the photodetectors.

Examples of scintillators currently suitable for the application to various radiation detectors include a pyrosilicate scintillator $Ce:Gd_2Si_2O_7$. The scintillator has the advantages of chemical stability, the absence of cleavability and deliquescence, excellence in processability, and being high in light emission amount. A pyrosilicate scintillator using light emission from the 4f5d level of $Ce^{3+}$ disclosed in Non Patent Literature 1, for example, has a short fluorescence lifetime of about 80 ns or less and also has a large light emission amount. On the other hand, however, as described in Non Patent Literature 1, the scintillator has the problem that because of being a peritectic composition on the phase diagram, single crystal growth from a melt is impossible, and it is difficult to obtain a large transparent body.

Pyrosilicate scintillators described in Patent Literature 1 and Non Patent Literature 2 are attempted to be a congruent melting composition by substituting Ce for some rare-earth-element sites. This substitution enables the crystal to be produced into a large single crystal by melt growth methods such as the floating zone method, the Czochralski method, the micro pulling-down method, and the Bridgman method. However, increased Ce at the sites of the rare earth element leads to the problem (concentration quenching) that the light emission amount dramatically decreases.

It is described that, for $(Gd_{1-x}Ce_x)_2Si_2O_7$ described in Patent Literature 1, $0.1<x<0.3$ is particularly preferable from the viewpoint of stable crystal growth, although the light emission amount decreases. Still, examples that extract a single crystal from a polycrystallized body are described.

CITATION LIST

Patent Literature

Patent Literature 1: Japanese Patent Application Laid-open No. 2009-74039

Non Patent Literature

Non Patent Literature 1: S. Kawamura, J. H. Kaneko, M. Higuchi, T. Yamaguchi, J. Haruna, Y. Yagi, K. Susa, F. Fujita, A. Homma, S. Nishiyama, H. Ishibashi, K. Kurashige, and M. Furusaka, IEEE Nuclear Science Symposium Conference Record, San Diego, USA, 29 Oct.-5 Nov. 2006, pp. 1160-1163.

Non Patent Literature 2: S. Kawamura, M. Higuchi, J. H. Kaneko, S. Nishiyama, J. Haruna, S. Saeki, S. Ueda, K. Kurashige, H. Ishibashi, and M. Furusaka, Crystal Growth & Design, volume 9 (3), 2009, pages 1470-1473.

Non Patent Literature 3: S. Kurosawa, M. Sugiyama, T. Yanagida, Y. Yokota, and A. Yoshikawa, Nuclear Instruments and Methods in Physics Research Section A, Volume 690, 2012, Pages 53-57.

SUMMARY

Technical Problem

As described above, the crystal material used as a scintillator is required to have a large light emission amount and a short fluorescence lifetime.

The present invention has been made in view of the above, and an object thereof is to provide a crystal material having a large light emission amount and a short fluorescence lifetime and a radiation detector, an imaging apparatus, a nondestructive inspection apparatus, and a lighting apparatus containing the crystal material.

Solution to Problem

To solve the problems and to attain the object, there is provided a crystal material represented by a general formula (1):

$$(Gd_{1-x-y-z}La_xME_yRE_z)_2(Si_{1-v}MM_v)_2O_7 \quad (1)$$

where ME is at least one selected from Y, Yb, Sc, and Lu; RE is a transition metal or rare earth element; MM is at least one selected from Ge, Sn, Hf, and Zr; and ranges of x, y, z, and v are represented by the following (i) or (ii): (i) $0.05 \le x+z<1.0$, $0.0 \le y \le 1.0$, $0.0001 \le z<0.05$, and $v=0.0$ (where, when RE is Ce, $y=0$ is an exception) or (ii) $0.0 \le x+y+z \le 1.0$, $0.0001 \le z \le 0.05$, and $0.0<v$ (where, when MM is Hf and $v=1$, $y=0$).

There is provided the crystal material according to the present invention, in which the ranges of x, y, z, and v are further represented by, in (i), $0.07 \le x+z \le 0.6$, $0.0 \le y \le 0.7$, $0.002 \le z \le 0.02$, and $v=0.0$ (where, when RE is Ce, $y=0$ is an exception) and further represented by, in (ii), $0.07 \le x+y+z \le 0.6$, $0.001 \le z \le 0.05$, and $0.0<v$.

There is provided the crystal material according to the present invention, in which the ranges of x, y, z, and v are further represented by, in (i), $0.10 \le x+z \le 0.47$, $0.00 \le y \le 0.53$, $0.003 \le z \le 0.015$, and $v=0.0$ (where, when RE is Ce, $y=0$ is an exception) and further represented by, in (ii), $0.10 \le x+y+z \le 0.47$, $0.001 \le z \le 0.05$, and $0.0<v$.

There is provided the crystal material according to the present invention, in which the crystal material emits fluorescence through irradiation with high-energy photons or particles of 2 eV or more, with a certain fluorescent component contained in the fluorescence having a fluorescence lifetime of 1,000 nanoseconds or less and a peak fluorescence wavelength of 250 nm or more and 900 nm or less.

There is provided the crystal material according to the present invention, in which the crystal material emits fluorescence through irradiation with high-energy photons or particles of 2 eV or more, with a certain fluorescent component contained in the fluorescence having a fluorescence lifetime of BO nanoseconds or less and a peak fluorescence wavelength of 300 nm or more and 700 nm or less.

There is provided the crystal material according to the present invention, in which the crystal material emits fluorescence through irradiation with high-energy photons or particles of 2 eV or more, with a certain fluorescent component contained in the fluorescence having a fluorescence lifetime of 60 nanoseconds or less and a peak fluorescence wavelength of 320 nm or more and 700 nm or less.

There is provided the crystal material according to the present invention, in which with a light emission amount of the fluorescent component when an environmental temperature is 0° C. as a reference, a reduction rate of the light emission amount of the fluorescent component in an environmental temperature range of from room temperature to 150° C. from the reference is less than 20%.

There is provided a radiation detector including: a scintillator that comprises the crystal material according to the present invention; and a photodetector that receives fluorescence from the scintillator.

There is provided a radiation detector including: a scintillator that comprises the crystal material according to the present invention; a wavelength conversion element that receives fluorescence from the scintillator and converts wavelengths of light with wavelengths of from 260 nm to 350 nm contained in the fluorescence into any wavelength within a range of from 320 nm to 700 nm; and a photodetector that receives light wavelength-converted by the wavelength conversion element.

There is provided a radiation detector including: a scintillator that comprises the crystal material according to the present invention or a crystal material represented by $(Gd_{1-x-z}La_xRE_z)_2Si_2O_7$ (where RE is a transition metal or a rare earth metal and $0 \le x+z \le 1$ and $0<x$); and a photodetector that operates at an environmental temperature of room temperature or more and 200° C. or less and receives fluorescence from the scintillator.

There is provided an imaging apparatus including the radiation detector according to the present invention.

There is provided a nondestructive inspection apparatus comprising the radiation detector according to the present invention.

There is provided a lighting apparatus comprising a light-emitting body that comprises the crystal material according to the present invention or a crystal material represented by $(Gd_{1-x-z}La_xRE_z)_2Si_2O_7$ (where RE is a transition metal or a rare earth metal and $0 \le x+z \le 1$ and $0<x$).

Advantageous Effects of Invention

The present invention produces an effect of achieving a crystal material having a large light emission amount and a short fluorescence lifetime.

BRIEF DESCRIPTION OF DRAWINGS

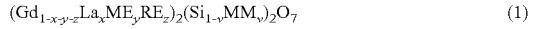

DESCRIPTION OF EMBODIMENTS

The following describes embodiments of a crystal material, a radiation detector, an imaging apparatus, a nondestructive inspection apparatus, and a lighting apparatus according to the present invention in detail with reference to the drawings. The present invention is not limited by the embodiments.

The crystal material according to the embodiment of the present invention is a crystal material represented by a general formula (1):

$$(Gd_{1-x-y-z}La_xME_yRE_z)_2(Si_{1-v}MM_v)_2O_7 \tag{1}$$

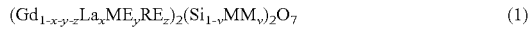

where ME is at least one selected from Y, Yb, Sc, and Lu; RE is a transition metal or rare earth element; MM is at least one selected from Ge, Sn, Hf, and Zr; and ranges of x, y, z, and v are represented by the following (i) or (ii):

(i) $0.05 \leq x+z \leq 1.0$, $0.0 \leq y \leq 1.0$, $0.0001 \leq z < 0.05$, and $v=0.0$ (where, when RE is Ce, $y=0$ is an exception) or (ii) $0.0 \leq x+y+z \leq 1.0$, $0.0001 \leq z \leq 0.05$, and $0.0 < v$.

Preferably, the ranges of x, y, z, and v are further represented by, in (i), $0.07 \leq x+z \leq 0.6$, $0.0 \leq y \leq 0.7$, $0.002 \leq z \leq 0.02$, and $v=0.0$ (where, when RE is Ce, $y=0$ is an exception) and further represented by, in (ii), $0.07 \leq x+y+z \leq 0.6$, $0.001 \leq z \leq 0.05$, and $0.0 < v$.

More preferably, the ranges of x, y, z, and v are further represented by, in (i), $0.10 \leq x+z \leq 0.47$, $0.00 \leq y \leq 0.53$, $0.003 \leq z \leq 0.015$, and $v=0.0$ (where when RE is Ce, $y=0$ is an exception) and further represented by, in (ii), $0.10 \leq x+y+z \leq 0.47$, $0.001 \leq z \leq 0.05$, and $0.0 < v$.

With these compositions, the crystal material according to the present embodiment is a crystal material having a large light emission amount of scintillation light generated through the irradiation with radiation and a short fluorescence lifetime.

Although known pyrosilicate scintillators are expected to have a large light emission amount, there arises the problem that they become a congruent melting composition only after substituting Ce or La for sites of the rare earth element, and it is extremely difficult to produce transparent bulk bodies. On the other hand, however, increased La at the sites of the rare earth element leads to the problem that the effective atomic number $Z_{eff}$ decreases. Increased Ce at the sites of the rate earth element leads to the problem that the light emission amount dramatically decreases. Against these circumstances, the crystal material according to the present embodiment is configured to solve these problems.

Figure 17:
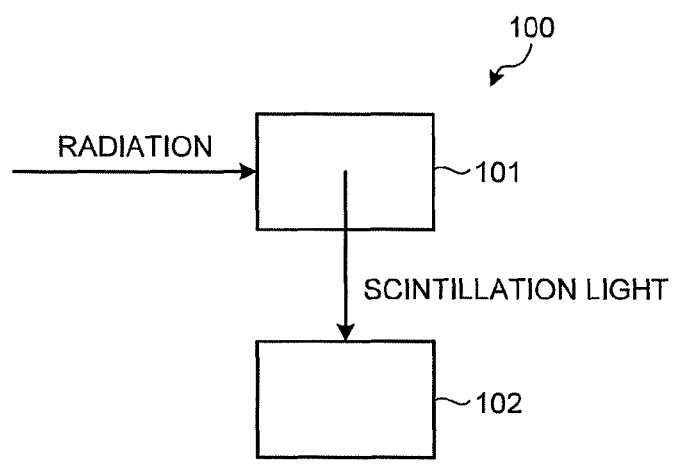
FIG. 17 is a diagram illustrating a radiation detector according to an embodiment of the present invention.
Figure 18:
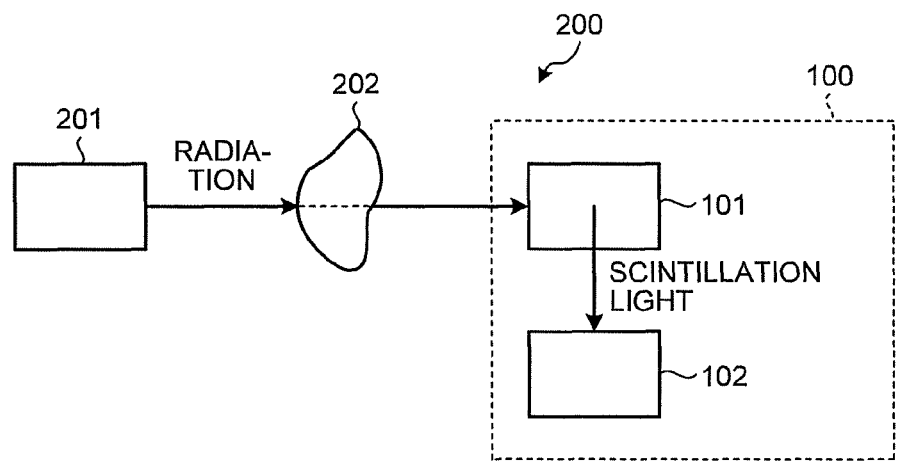
FIG. 18 is a diagram illustrating a nondestructive inspection apparatus according to an embodiment of the present invention.

As illustrated in FIG. 17, for example, the crystal material according to the present embodiment can be used as a radiation detector 100 by being combined with a photodetector 102 that can receive scintillation light generated by a crystal materiel 101 as the crystal. Furthermore, as illustrated in FIG. 18, for example, the crystal material according to the present embodiment can also be used as a radiation measuring apparatus or a resource exploration apparatus as a nondestructive inspection apparatus 200 by irradiating an object under measurement 202 with radiation from a radiation source 201 and detecting the radiation having passed through the object under measurement 202 by the radiation detector 100.

Figure 19:
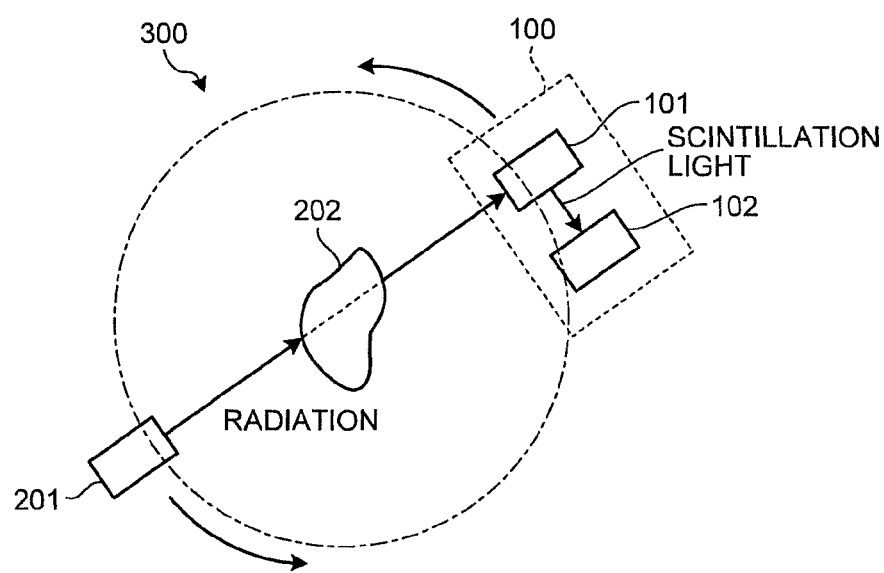
FIG. 19 is a diagram illustrating an imaging apparatus according to an embodiment of the present invention.

The crystal material according to the present embodiment emits scintillation light containing fluorescence through the irradiation with high-energy photons or particles of 2 eV or more, in which the fluorescence lifetime of a fluorescent component contained in the scintillation light can be 1,000 ns or less and preferably 120 ns or less, and the peak fluorescence wavelength thereof can be within the range of 250 nm or more and 900 nm or less. The fluorescence lifetime is thus short, and only a short sampling time for fluorescence measurement is required, and high time resolution can be achieved, that is, a sampling interval can be reduced. The achievement of the high time resolution can increase the sampling number per unit time. The crystal material having such short-lifetime emission can be suitably used as a scintillator for radiation detection with high-speed response for PET, single photon emission computed tomography (SPECT), and CT as imaging apparatuses. As illustrated in FIG. 19, for example, the radiation source 201 and the radiation detector 100 are arranged at symmetrical points on the circumference of a circle, and tomographic images of the object under measurement 202 are acquired while scanning the radiation source 201 and the radiation detector 100 along the circumference, thereby enabling use as an imaging apparatus 300 using CT.

Figure 20:
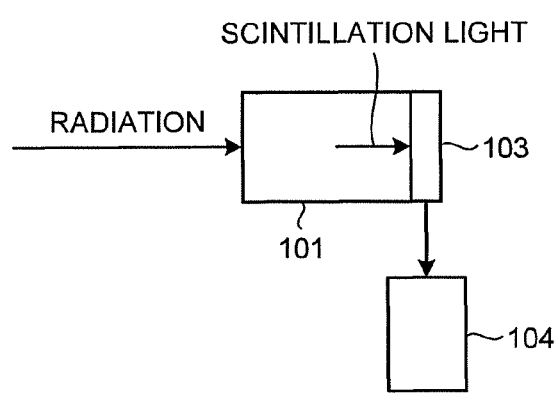
FIG. 20 is a diagram illustrating a radiation detector according to an embodiment of the present invention.

The peak fluorescence wavelength of the fluorescent component is within the range of 250 nm or more and 900 nm or less, and the fluorescence component can be detected through combination with semiconductor photodetectors such as PDs, APDs, and Si-PMs formed of silicon semiconductors. When the peak fluorescence wavelength is 400 nm or less in particular, it is effective that the peak fluorescence wavelength is converted into any wavelength of 300 nm or more and 900 nm or less, that is, any wavelength within the range in which the above photodetectors have sufficient wavelength sensitivity using a wavelength conversion element. As illustrated in FIG. 20, for example, by using a plastic optical fiber for wavelength conversion (Y11(200) M-S manufactured by Kuraray, Co., Ltd., for example) or the like as a wavelength conversion element 103, scintillation light emitted by the crystal materiel 101 is wavelength-converted and can then be detected by a photodetector 104. The type of the photodetector 104 to be combined can be appropriately used in accordance with the peak fluorescence wavelength or the like; PMTs or PS-PMTs, for example, may be used.

In the crystal material according to the present embodiment, when the fluorescence lifetime of the fluorescent component contained in the scintillation light generated through the irradiation with high-energy photons or particles of 2 eV or more is 80 ns or less, and when the peak fluorescence wavelength thereof is within the range of 300 nm or more and 700 nm or less, the detection of the scintillation light with higher resolution and higher sensitivity can be achieved. When the fluorescence lifetime is 60 ns or less, and when the peak fluorescence wavelength thereof is within the range of 320 nm or more and 700 nm or less, the detection of the scintillation light with even higher resolution and even higher sensitivity can be achieved, which is thus preferred. The adjustment of the fluorescence lifetime and the peak fluorescence wavelength can be achieved by adjusting the composition of the crystal material. When a Ce concentration is increased, for example, the fluorescence lifetime shortens.

In the crystal material according to the present embodiment, with a light emission amount of the fluorescent component when an environmental temperature is 0° C. as a reference, a reduction rate of the light emission amount of the fluorescent component in an environmental temperature range of from room temperature to 150° C. from the reference can be less than 20% and preferably less than 15%. Also for a quantum yield, a reduction rate of the light emission amount of the fluorescent component in the range of from room temperature to 150° C. from the reference can be less than 20%. Thus, the crystal material according to the present embodiment can reduce a reduction in the light emission amount even under a high-temperature environment and is thus extremely useful as a crystal material used under the high-temperature environment.

In particular, a scintillator formed of the crystal material according to the present embodiment or a scintillator formed of a crystal material represented by $(Gd_{1-x-z}La_xRE_z)_2Si_2O_7$ (where RE is a transition metal or a rare earth metal such as Pr or Ce and $0 \leq x+z \leq 1$) and a photodetector that operates at an environmental temperature of room temperature or more and 200° C. or less are combined to constitute a radiation detector, thereby enabling the radiation detector to be used without cooling for resource exploration or the like that requires measurement under a high-temperature environment, which is thus preferred.

The following describes a method for manufacturing a single crystal of the crystal material according to the present embodiment. In a method for manufacturing a single crystal of any composition, general oxide raw materials can be used as starting materials. For a single crystal for scintillator use, high-purity raw materials with 99.99% or more (4 N or more) are particularly preferably used. These starting materials are weighed and mixed so as to form a target composition when a melt is formed and are used as crystal growth raw materials. These starting materials particularly preferably contain impurities other than the target composition in an amount as small as possible (1 ppm or less, for example). In particular, these starting materials preferably contain elements (Tb, for example) that emit light near the wavelength of the scintillation light of the crystal material or elements (Fe, Cr, or the like) that change in valence in an amount as small as possible.

The growth of the crystal is preferably performed in an atmosphere of inert gas (Ar, $N_2$, He, or the like). A mixed gas of the inert gas (Ar, $N_2$, He, or the like) and an oxygen gas may be used. When the growth of the crystal is performed in an atmosphere of the mixed gas, however, the partial pressure of oxygen is preferably 2% or less for the purpose of preventing oxidation of a crucible. When a method of production that does not use any crucible such as the floating zone method is used, however, the partial pressure of oxygen can be set up to 100%. In later processes such as annealing after the crystal growth, the oxygen gas, the inert gas (Ar, $N_2$, He, or the like), and the mixed gas of the inert gas (Ar, $N_2$, He, or the like) and the oxygen gas can be used. In the later processes, when the mixed gas is used, any mixture ratio with an oxygen partial pressure of from 0% to 100% may be used without the limitation that the oxygen partial pressure is 2% or less.

Examples of the method for manufacturing a single crystal of the crystal material according to the present embodiment include, but not limited to, various crystal growth methods such as, in addition to the micro pulling-down method, the Czochralski method (a pulling-up method), the Bridgman method, the zone melt method, the edge-defined film-fed growth (EFG) method, and the floating zone method. In order to obtain large single crystals, the Czochralski method or the Bridgman method is preferred. By using large single crystals, the yield of the single crystals is increased, and processing loss can be relatively reduced. Consequently, crystal materials with lower cost and higher quality can be obtained than those obtained by such a method that extracts a single crystal from a polycrystallized body as described in Patent Literature 1. However, the crystal material according to the present embodiment is not limited to the single crystal and may be a polycrystalline sintered body such as ceramics.

When only a small single crystal is used as the single crystal for scintillator use, the floating zone method, the zone melt method, the EFG method, the micro pulling-down method, or the Czochralski method is preferred due to the absence of or less necessity of post-processing. The micro pulling-down method or the zone melt method is particularly preferred for the reason of wettability with crucibles or the like.

Examples of materials that can be used for the crucible and an after heater include platinum, iridium, rhodium, rhenium, and alloys of these elements.

In the manufacture of the single crystal for scintillator use, a high-frequency oscillator, a light-concentrating heater, and a resistance heater may further be used.

Although the following describes a method for manufacturing a single crystal using the micro pulling-down method and the floating zone method as examples of the method for manufacturing a single crystal of the crystal material according to the present embodiment, the method for manufacturing a single crystal of the crystal material according to the present embodiment is not limited to this example.

The micro pulling-down method can be performed using an atmosphere-controlled micro pulling-down apparatus by known high-frequency induction heating. The micro pulling-down apparatus is an apparatus for manufacturing a single crystal including, for example, a crucible containing a raw melt, a seed-crystal holder that holds a seed crystal to be in contact with the raw melt flowing out of a pore provided in the bottom of the crucible, a moving mechanism that moves the seed-crystal holder downward, a moving-speed controller that controls the speed of the moving mechanism, and an induction heating unit (a high-frequency induction heating coil, for example) that heats the crucible. Such an apparatus for manufacturing a single crystal forms a solid-liquid interface immediately below the crucible and moves the seed crystal downward, thereby producing a single crystal.

In the micro pulling-down apparatus, the crucible is formed of carbon, platinum, iridium, rhodium, rhenium, or an alloy of these elements. The after heater as a heating element formed of carbon, platinum, iridium, rhodium, rhenium, or an alloy of these elements is arranged on the perimeter of the bottom of the crucible. Outputs of the respective induction heating units of the crucible and the after heater are adjusted to adjust a calorific value, thereby controlling the temperature and its distribution of the solid-liquid interface of the raw melt pulled out of the pore provided in the bottom of the crucible.

The atmosphere-controlled micro pulling-down apparatus is an apparatus that uses stainless steel (SUS) for the material of a chamber and quartz for a window material, includes a rotary pump for enabling atmospheric control, and can make the degree of vacuum thereinside $1 \times 10^{-3}$ Torr or less before gas substitution. An Ar, $N_2$, $H_2$, or $O_2$ gas or the like can be introduced into the chamber with its flow precisely controlled by an accompanying gas flow meter.

Using this apparatus, the crystal growth raw materials prepared by the above method are put into the crucible. A furnace is evacuated to be high vacuum, and an Ar gas or a mixed gas of an Ar gas and an $O_2$ gas is introduced into the furnace, thereby making the inside of the furnace an inert gas atmosphere or a low-oxygen-partial-pressure atmosphere. Next, a high-frequency power is gradually applied to the high-frequency induction heating coil to heat the crucible, thereby perfectly melting the raw materials within the crucible.

Subsequently, the seed crystal held by the seed-crystal holder is gradually raised at a certain speed by the moving mechanism. A tip of the seed crystal is brought into contact with the pore at the lower end of the crucible to be sufficiently fit therewith, and then the seed crystal is lowered while adjusting the temperature of the melt, thereby growing a crystal.

Although the seed crystal is preferably equal to an object of crystal growth or close thereto in both structure and composition, the seed crystal is not limited to this example. The seed crystal preferably has clear crystal orientation.

When the prepared crystal growth raw materials are all crystallized, and the melt is exhausted, the crystal growth ends. For the purpose of maintaining the composition of the crystal to be grown to be uniform and for the purpose of increasing length, a device for continuously charging the crystal growth raw materials may be incorporated. With this incorporation, a crystal can be grown while charging the crystal growth raw materials.

The following describes the floating zone method. The floating zone method is a method that collects light of a halogen lamp or the like by generally two to four rotational ellipsoidal mirrors, places part of a sample rod formed of a polycrystal at their ellipsoidal focus, raises the temperature of the polycrystal by optical energy to melt the polycrystal, moves the melting part by gradually moving the mirrors (focus) while gradually cooling the melted part, thereby changing the sample rod into a large single crystal.

The floating zone method does not use any crucible and thus can grow a crystal with higher purity. Furthermore, a crystal can be grown even under a condition in which crystal growth is difficult owing to oxidation of a crucible in an oxygen atmosphere.

Although the following describes examples and a comparative example of the present invention in detail with reference to the drawings, the invention is not limited thereto. In the following examples, the Ce concentration is described either as a concentration in a specific crystal or as a concentration in a melt (preparation); in the examples, there was a relation in which the concentration at the time of preparation was about 1 to 10 with respect to the concentration in the crystal of 1.

Example 1

Figure 1:
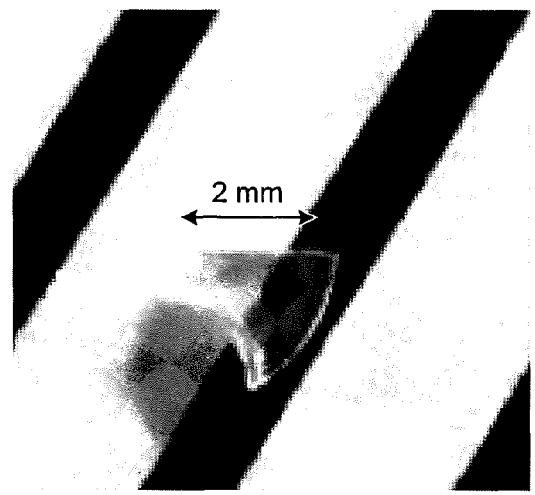
FIG. 1 is a drawing illustrating a photograph of a produced $(Ce_{0.01}Lu_{0.20}La_{0.25}Gd_{0.54})_2Si_2O_7$ (Ce1%: GLaLuPS) crystal.

A crystal represented by a composition of $(Ce_{0.01}Lu_{0.20}La_{0.25}Gd_{0.54})_2Si_2O_7$ (Ce1%:GLaLuPS) was produced by the floating zone method. The crystal was a pyrosilicate crystal as one kind of a pyrochlore-type oxide represented by $A_2B_2O_7$. FIG. 1 is a drawing illustrating a photograph of the produced $(Ce_{0.01}Lu_{0.20}La_{0.25}Gd_{0.54})_2Si_2O_7$ (Ce1%:GLaLuPS) crystal. As illustrated in FIG. 1, the produced single crystal, through which the pattern thereunder was seen, was a transparent bulk body.

Example 2

Figure 2:
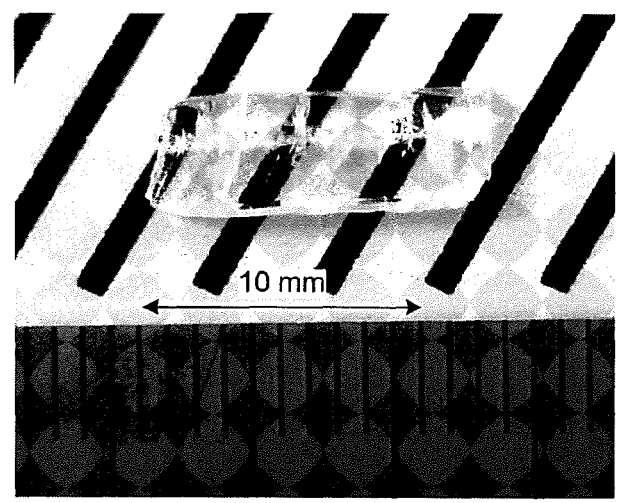
FIG. 2 is a drawing illustrating a photograph of a produced $(Pr_{0.01}Lu_{0.20}La_{0.25}Gd_{0.54})_2Si_2O_7$ (Pr1%: GLaLuPS) crystal.

A pyrosilicate crystal represented by a composition of $(Pr_{0.01}Lu_{0.20}La_{0.25}Gd_{0.54})_2Si_2O_7$ (Pr1%:GLaLuPS) was produced by the floating zone method. FIG. 2 is a drawing illustrating a photograph of the produced $(Pr_{0.01}Lu_{0.20}La_{0.25}Gd_{0.54})_2Si_2O_7$ (Pr1%:GLaLuPS) crystal. As illustrated in FIG. 2, the produced single crystal, through which the pattern thereunder was seen, was a transparent bulk body.

Example 3

Figure 3:
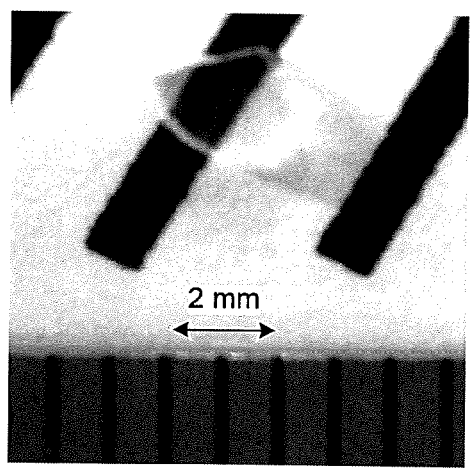
FIG. 3 is a drawing illustrating a photograph of a produced $(Pr_{0.01}La_{0.09}Gd_{0.9})_2Si_2O_7$ (Pr1%:GLaPS) crystal.

A pyrosilicate crystal represented by a composition of $(Pr_{0.01}La_{0.09}Gd_{0.9})_2Si_2O_7$ (Pr1%:GLaPS) was produced by the floating zone method. FIG. 3 is a drawing illustrating a photograph of the produced $(Pr_{0.01}La_{0.09}Gd_{0.9})_2Si_2O_7$ (Pr1%:GLaPS) crystal. As illustrated in FIG. 3, the produced single crystal, through which the pattern thereunder was seen, was a transparent bulk body.

Example 4

Figure 4:
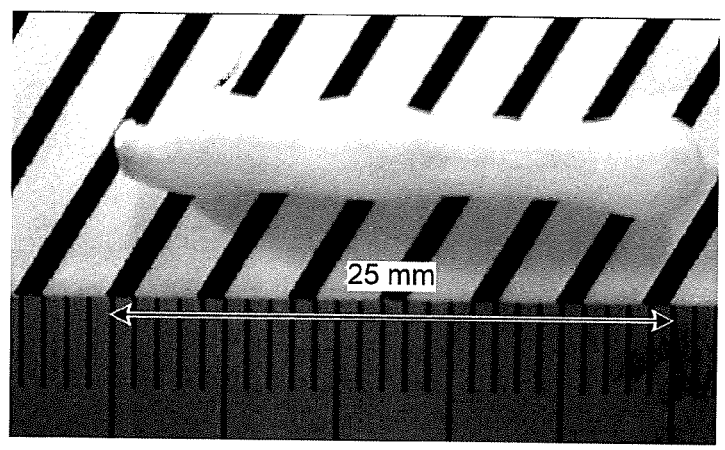
FIG. 4 is a drawing illustrating a photograph of a produced $(Ce_{0.01}La_{0.09}Gd_{0.9})_2Ge_2O_7$ (Ce1%:GLaPG) crystal.

A pyrogermanate crystal represented by a composition of $(Ce_{0.01}La_{0.09}Gd_{0.9})_2Ge_2O_7$ (Ce1%:GLaPG) was produced by the floating zone method. FIG. 4 is a drawing illustrating a photograph of the obtained $(Ce_{0.01}La_{0.09}Gd_{0.9})_2Ge_2O_7$ (Ce1%:GLaPG) crystal. In Example 4, the substitution of Ge for Si for increasing an effective atomic number $Z_{eff}$ of the crystals was performed. The effect of the substitution is, not limited to Ge, also expected in other pyrochlore-type oxides, in which Sn, Pb, Zr, Hf, or the like substitutes for Si.

Example 5

Figure 5:
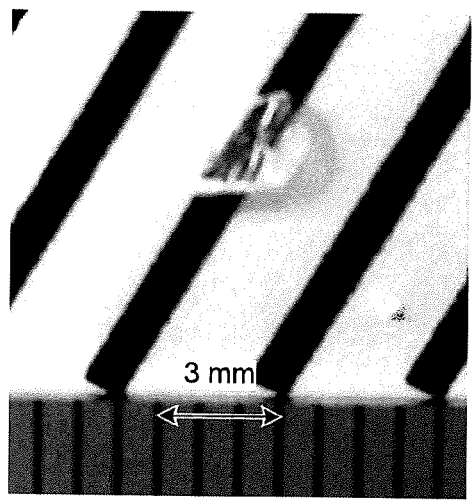
FIG. 5 is a drawing illustrating a photograph of a produced $(Ce_{0.01}La_{0.09}Gd_{0.7}Y_{0.2})_2Si_2O_7$ (Ce1%:GLaYPS) crystal.

A pyrosilicate crystal represented by a composition of $(Ce_{0.01}La_{0.09}Gd_{0.7}Y_{0.2})_2Si_2O_7$ (Ce1%: GLaYPS) was produced by the floating zone method. FIG. 5 is a drawing illustrating a photograph of the obtained $(Ce_{0.01}La_{0.09}Gd_{0.7}Y_{0.2})_2Si_2O_7$ (Ce1%:GLaYPS) crystal.

Example 6

Figure 6:
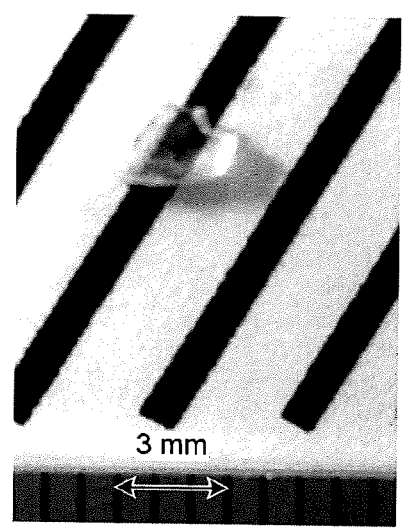
FIG. 6 is a drawing illustrating a photograph of a produced $(Ce_{0.01}La_{0.09}Gd_{0.9})_2(Si,Zr)_2O_7$ (Ce1%:GLaPSZ) crystal.

A pyrochlore crystal represented by a composition of $(Ce_{0.01}La_{0.09}Gd_{0.9})_2(Si,Zr)_2O_7$ (Ce1%:GLaPSZ) was produced by the floating zone method. FIG. 6 is a drawing illustrating a photograph of the obtained $(Ce_{0.01}La_{0.09}Gd_{0.9})_2(Si,Zr)_2O_7$ (Ce1%:GLaPSZ) crystal. In Example 6, the substitution of Zr for Si for increasing the effective atomic number $Z_{eff}$ of the crystal was performed.

Example 7

Figure 7:
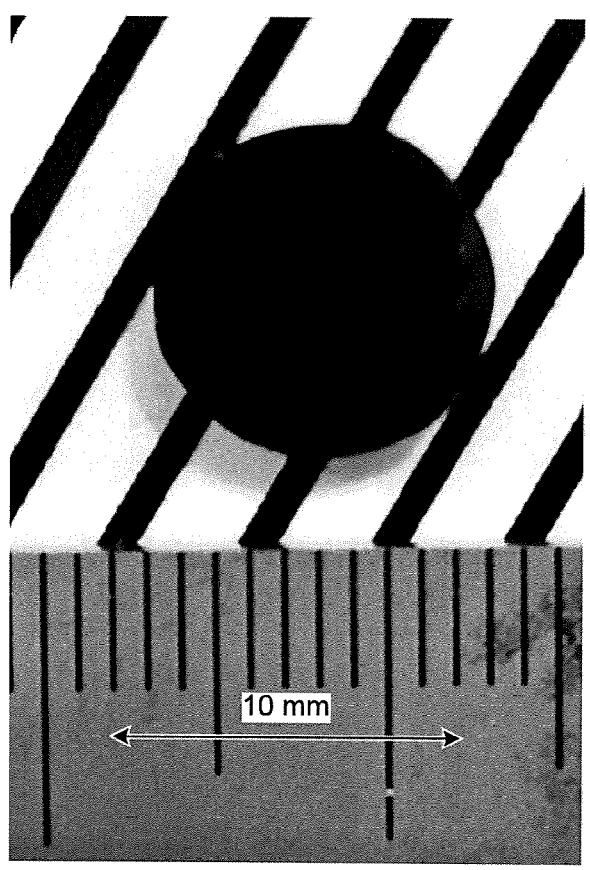
FIG. 7 is a drawing illustrating a photograph of a produced $(Ce_{0.01}Gd_{0.99})_2Hf_2O_7$ (Ce1%:GHO) crystal.

A pyrohafnate crystal represented by a composition of $(Ce_{0.01}Gd_{0.99})_2Hf_2O_7$ (Ce1%:GHO) was produced by the Czochralski method. FIG. 7 is a drawing illustrating a photograph of the obtained $(Ce_{0.01}Gd_{0.99})_2Hf_2O_7$ (Ce1%: GHO) crystal.

Example 8

Figure 8:
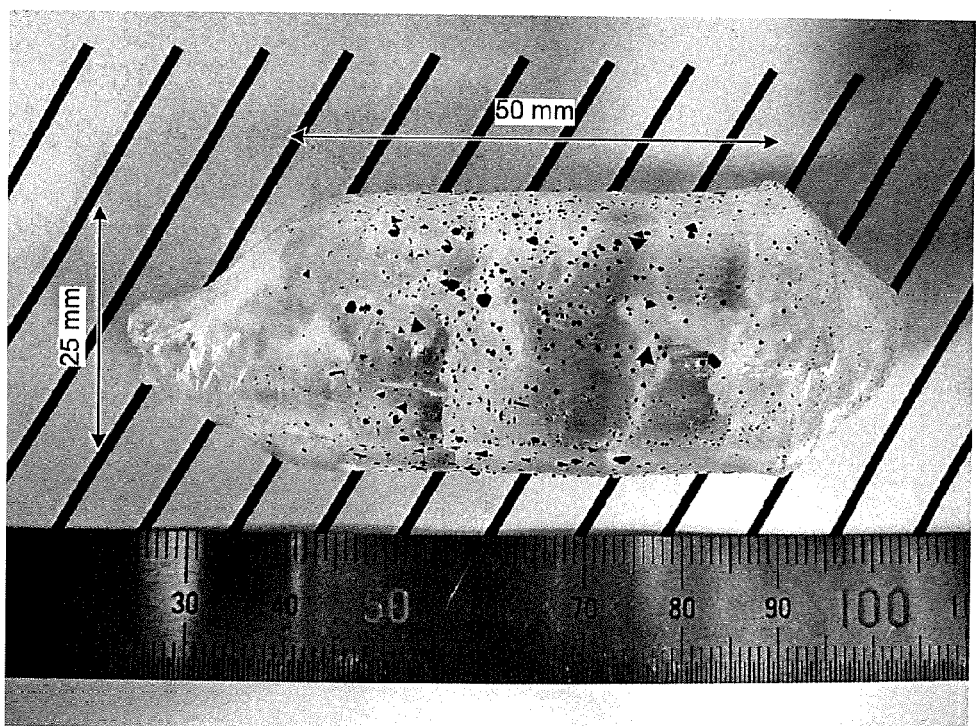
FIG. 8 is a drawing illustrating a photograph of a produced $(Ce_{0.01}La_{0.09}Gd_{0.9})_2Si_2O_7$ (Ce1%:GLaPS) crystal.

A pyrosilicate crystal represented by a composition of $(Ce_{0.01}La_{0.09}Gd_{0.9})_2Si_2O_7$ (Ce1%:LaPS) was produced by the Czochralski method. FIG. 8 is a drawing illustrating a photograph of the obtained $(Ce_{0.01}La_{0.09}Gd_{0.9})_2Si_2O_7$ (Ce1%:GLaPS) crystal with a size of 1 inch (about 25 mm). The present examples are not limited to the methods for growing and the size of the crystal.

The Czochralski method in Examples 7 and 8 is also called what is called the rotation pulling method, which is a method that brings a seed crystal into contact with a raw melt in a melted state within a crucible and pulls it up while rotating it slowly, thereby growing a crystal on the lower end of the seed crystal and producing a large single crystal.

Comparative Example

A commercially available $(Ce_{0.01}Gd_{0.99})_2SiO_5$ (Ce1%: GSO) crystal with dimensions of 5 mm×5 mm×5 mm was used as a known comparative example.

Figure 9:
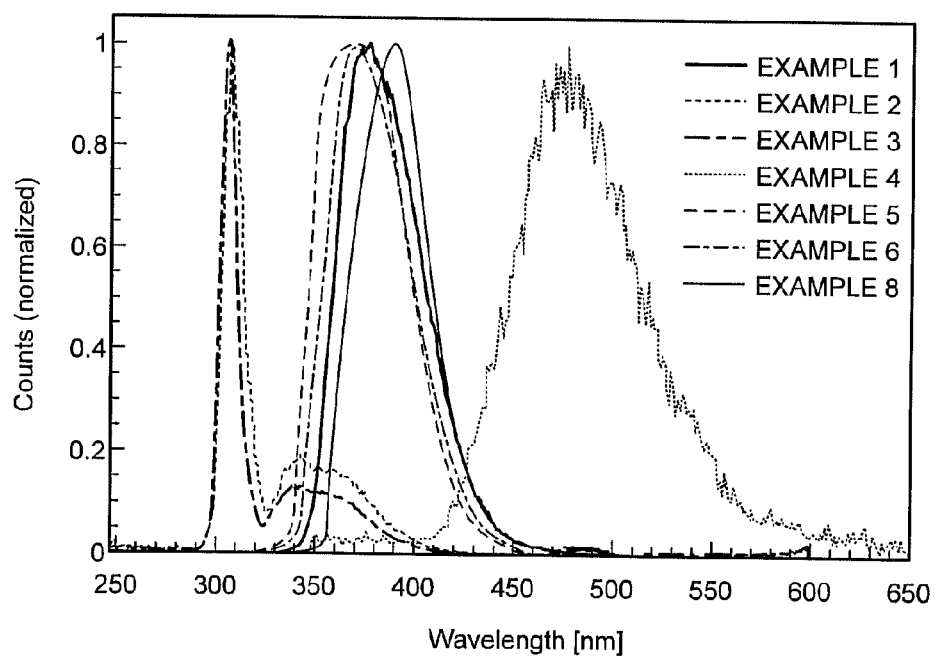
FIG. 9 is a diagram illustrating profiles of light emission characteristics of Examples 1, 2, 3, 4, 5, 6, and 8.

For the crystals of Examples 1, 2, 3, 4, 5, 6, and 8, light emission characteristics of respective pieces of scintillation light were measured by radioluminescence (excitation with 5.5 MeV alpha rays). For the measurement of light emission, a spectrometer manufactured by Edinburgh (model: Instrument FLS920) was used. FIG. 9 is a diagram illustrating obtained profiles. In FIG. 9, the horizontal axis is wavelength (nm), whereas the vertical axis is the number of counts (arbitrary unit) normalized with the respective peaks, which indicate light emission intensity. As illustrated in FIG. 9, the crystals of Examples 1, 2, 3, 4, 5, 6, and 8, had peak emission wavelengths in the range of from 300 nm to 500 nm.

Furthermore, light emission amounts of the crystals obtained in Examples 1 and 6 were estimated. The respective crystals were optically bonded to a photomultiplier tube (R7600 manufactured by Hamamatsu Photonics K.K.) as a photodetector with optical grease (6262A manufactured by Ohyo Koken Kogyo Co., Ltd.) and were irradiated with gamma rays using a $^{137}Cs$ sealed radiation source (gamma-ray source) or a $^{241}Am$ sealed radiation source (alpha-ray source) having a radioactivity of 1 MBq to be excited to emit light.

A voltage of 700 V was applied to the photomultiplier tube to convert scintillation light into an electric signal. The electric signal output from the photomultiplier tube is a pulse-shaped signal reflecting the received scintillation light, in which the wave height of the pulse indicates the light emission intensity of the scintillation light. The electric signal thus output from the photomultiplier tube was shaped and amplified by a shaping amplifier and was then input to a multiple wave-height analyzer to be analyzed, and wave-height distribution spectra were created. Also for the (Ce1%: GSO) crystal of Comparative Example, a wave-height distribution spectrum was similarly created.

Figure 10:
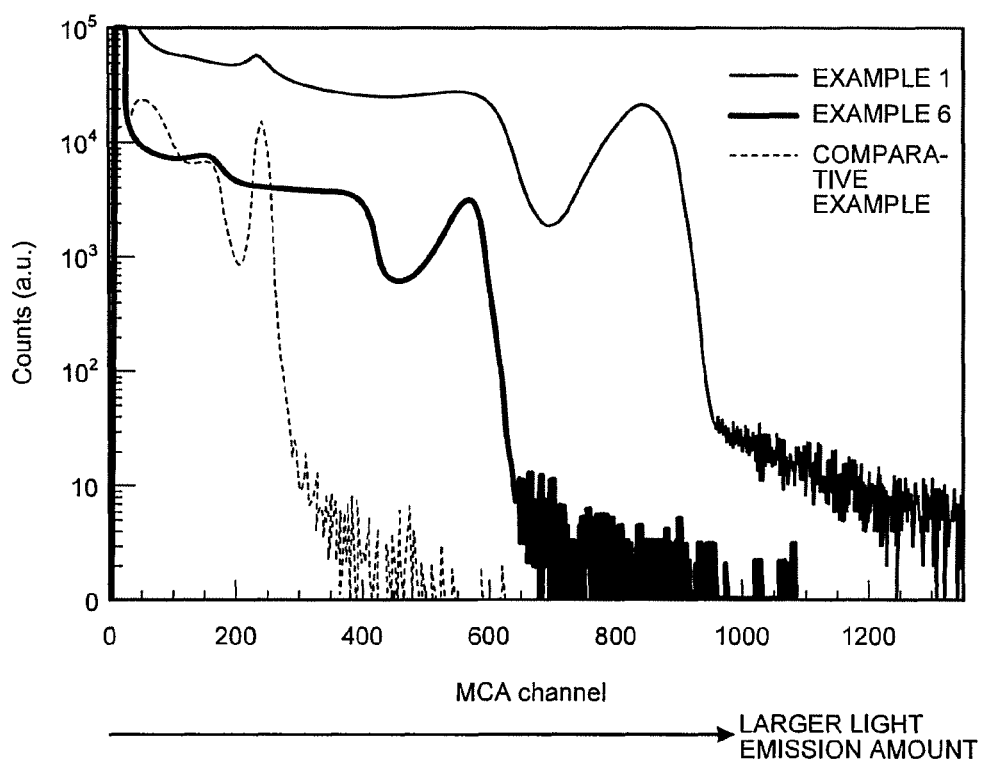
FIG. 10 is a diagram illustrating wave-height distribution spectra (Example 1, Example 6, and Comparative Example) obtained by irradiating with $^{137}$Cs gamma rays (662 keV.).

FIG. 10 is a diagram illustrating wave-height distribution spectra (Example 1, Example 6, and Comparative Example) obtained by irradiating with $^{137}Cs$ gamma rays (662 keV). In FIG. 10, the horizontal axis is the channel number of a multi-channel analyzer (MCA), which indicates the magnitude of signals. With respect to the horizontal axis, a photoelectric absorption peak caused by the 662 keV gamma rays being on the more right side of the drawing indicates a higher light emission amount. As can be seen from FIG. 10, the crystals of Example 1 and Example 6 showed higher light emission amounts than that of the crystal of Comparative Example. In FIG. 10, the light emission amounts of the crystals of Example 1 and Example 6 were 35,000 and 24,000 photons/MeV, respectively.

Next, decay times of the crystals of Example 1 and Example 6 were determined. The respective crystals were optically bonded to a photomultiplier tube (R7600 manufactured by Hamamatsu Photonics K.K.) with optical grease (6262A manufactured by Ohyo Koken Kogyo Co., Ltd.) and were irradiated with gamma rays using a $^{137}Cs$ sealed radiation source having a radioactivity of 1 MBq to be excited to emit light. For signals from the photomultiplier tube, pieces of time distribution of the signals were measured by an oscilloscope (TDS 3034E manufactured by Tektronix, Inc.) to determine the decay times.

Figure 11:
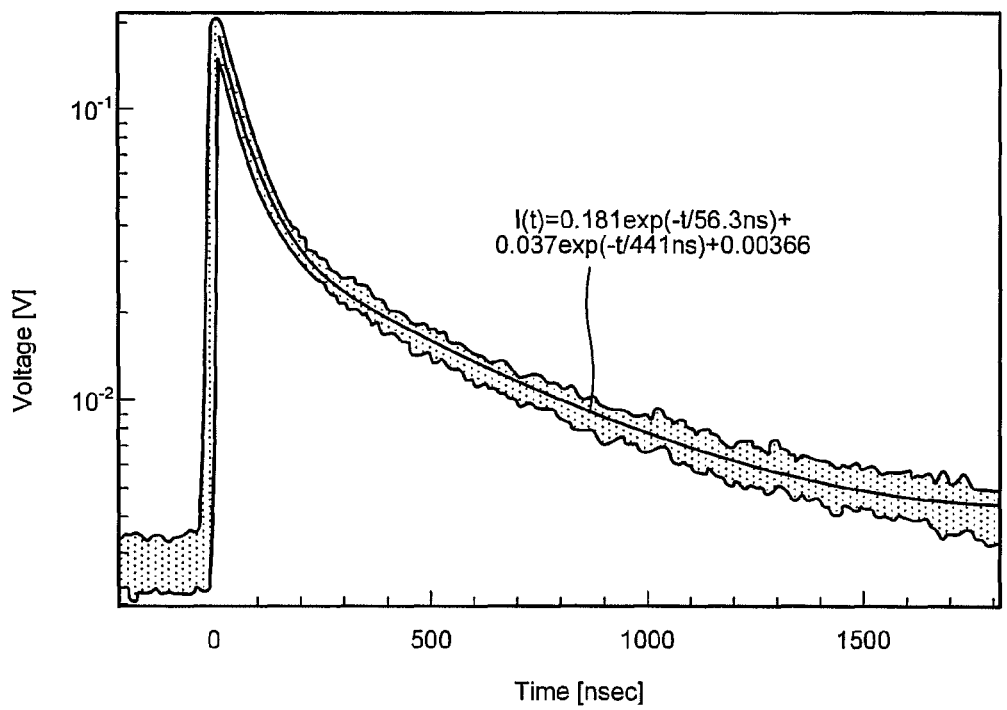
FIG. 11 is a diagram illustrating a profile of a fluorescence decay curve of a crystal of Example 1.

FIG. 11 is a diagram illustrating a profile of a fluorescence decay curve of the crystal of Example 1. In FIG. 11, the horizontal axis shows time, whereas the vertical axis shows voltage corresponding to light emission intensity. The solid line is a result obtained by fitting with the following function I(t) with time t as a variable in order to determine a decay constant, where $$I(t)=0.181 \times \exp(-t/56.3 \text{ ns})+0.037 \times \exp(-t/441 \text{ ns})+0.00366$$

Specifically, the decay time of the fluorescence of the crystal of Example 1 was 56.3 ns, which was able to constitute a high-speed scintillator.

Figure 12:
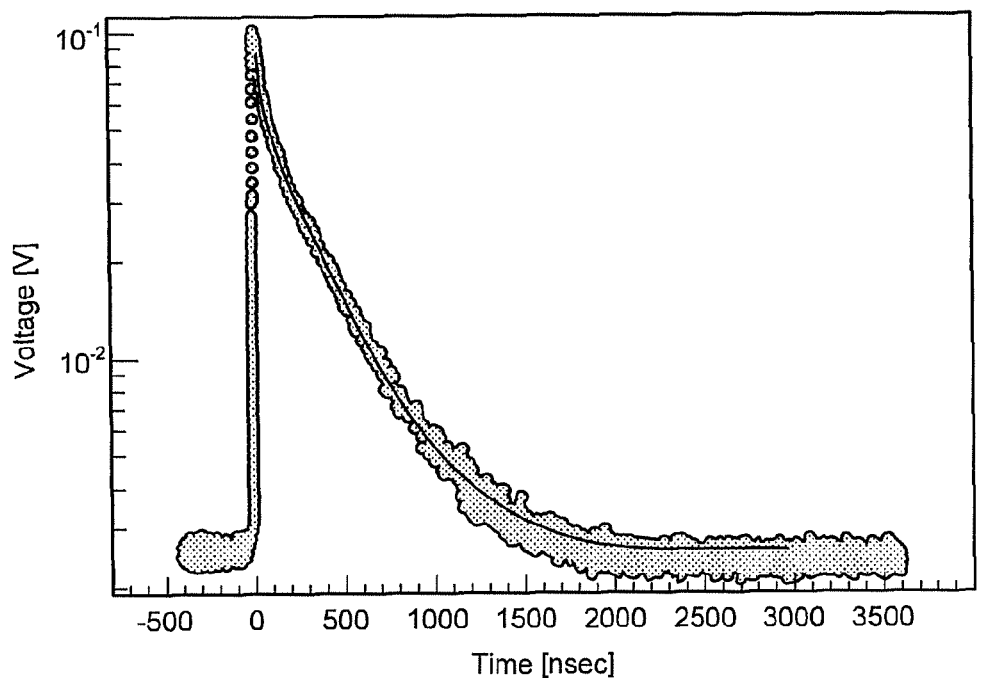
FIG. 12 is a diagram illustrating a profile of a fluorescence decay curve of a crystal of Example 6.

FIG. 12 is a diagram illustrating a profile of a fluorescence decay curve of the crystal of Example 6. In FIG. 12, the horizontal axis shows time, whereas the vertical axis shows voltage corresponding to light emission intensity. Similarly, the decay constant was determined from the fluorescence decay curve, and the decay time of the fluorescence of the crystal of Example 6 was 41.6 ns.

Next, in PET, important performance is time resolution in total combining a scintillator, a photodetector such as a photomultiplier tube, and its post-stage circuit in order to increase the resolution of images. Thus, using the crystal of Example 1 as the scintillator, operating principle demonstration as PET was performed.

Specifically, two units of a combination of the scintillator crystal of Example 1 and a photomultiplier tube (H6610 manufactured by Hamamatsu Photonics K.K.) were prepared, and a $^{22}$Na sealed radiation source was placed in the middle of the two to linearly align the two scintillator crystals and the $^{22}$Na sealed radiation source. The $^{22}$Na sealed radiation source emits pair annihilation gamma rays, which are gamma rays emitted with an energy of two photons, 511 keV simultaneously in 180-degree directions. The pair annihilation gamma rays are used in the actual PET imaging. The two pair annihilation gamma rays are received by respective photomultiplier tubes. Information on times when signals from the photomultiplier tubes are generated was digitized, statistics were taken on difference information between the two times, and time resolution was derived. Ideally, there should not be any time difference, because the gamma rays from the $^{22}$Na sealed radiation source are emitted simultaneously, but actually, the influence of the decay time of the scintillator or the post-stage circuit produces difference.

Figure 13:
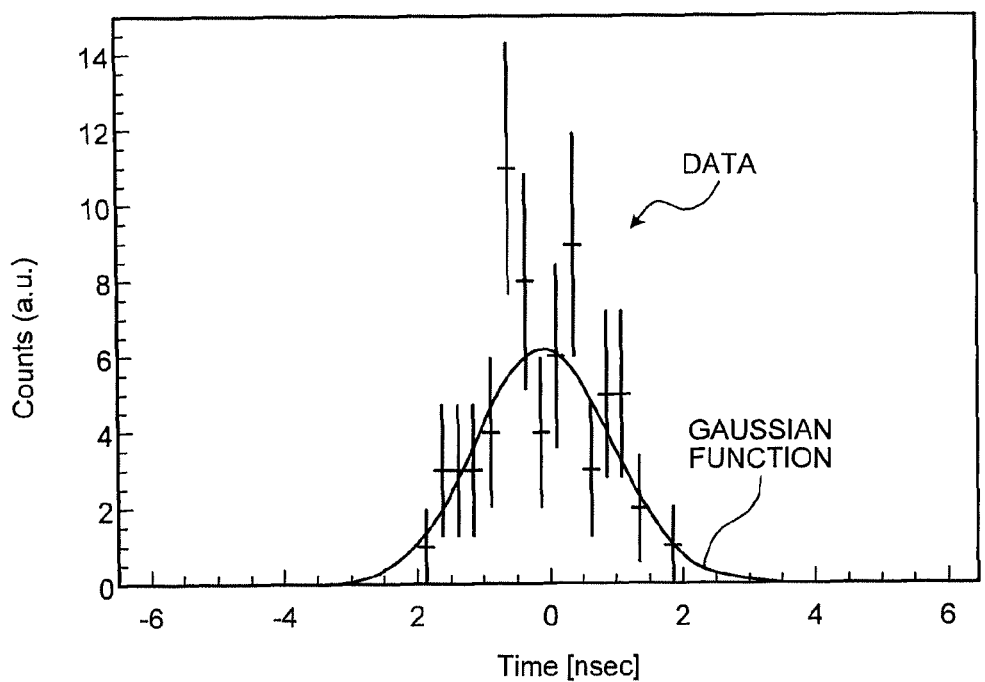
FIG. 13 is a diagram illustrating a result of a time resolution experiment.

FIG. 13 is a diagram illustrating a result of a time resolution experiment. In FIG. 13, the horizontal axis is the time difference between signals from the two scintillators, whereas the vertical axis is the number of counts (arbitrary unit). The solid line is a Gaussian function curve for fitting. From FIG. 13, the time resolution (FWHM) was 3 ns (derived from the Gaussian function).

The time resolution of the system using the scintillator crystal of Example 1 was equal in performance to conventional PET imaging. Besides, the scintillator crystal of Example 1 had a larger light emission amount than a light emission amount (20,000 to 30,000 photons/MeV) of a normal scintillator for PET. Consequently, the crystal of Example 1 is advantageous also as a scintillator for PET.

As described above, scintillators are used also for resource exploration such as oil exploration. During measurement, measurement under a high-temperature condition up to, for example, about 150° C. is required. Given this situation, the temperature dependence of the light emission amount was examined using a $(Ce_{0.01}La_{0.09}Gd_{0.9})_2Si_2O_7$ crystal produced as Example 9.

Specifically, R1288AH manufactured by Hamamatsu Photonics K.K. as a photomultiplier tube having heat resistance operable at up to 200° C. and the crystal of Example 9 were placed within a thermostat in combination, and scintillation light generated by being excited with a $^{137}$Cs sealed radiation source (gamma rays having an energy of 662 keV) while changing internal temperature (the environmental temperature of the crystal) was measured.

Figure 14:
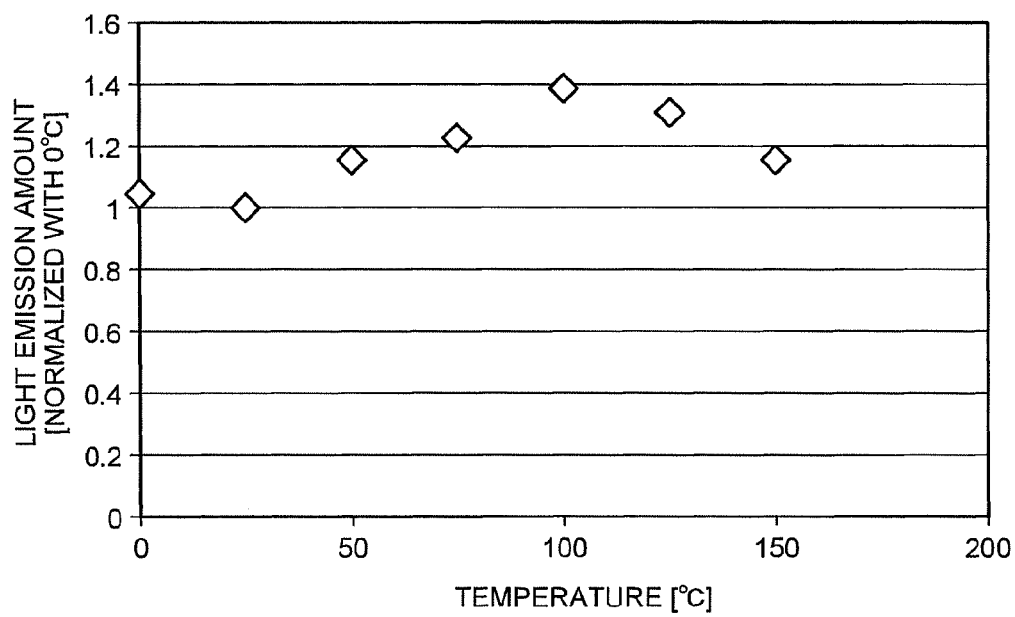
FIG. 14 is a diagram illustrating a relation between the environmental temperature of a crystal and a light emission amount.

FIG. 14 is a diagram illustrating a relation between the environmental temperature of the crystal and the light emission amount. In FIG. 14, the values are corrected considering the temperature dependence of the photomultiplier tube. In FIG. 14, the horizontal axis shows temperature (centigrade), whereas the vertical axis shows normalized light emission amount with the light emission amount determined from a photoelectric absorption peak caused by the 662 keV gamma rays at 0° C. as 1. From FIG. 14, it was revealed that the crystal of Example 9 had no reduction in light emission amount even at 150° C. compared with that at room temperature.

As described in Non Patent Literature 3 and references described therein, under a condition of 150° C., normal scintillators have a light emission amount about 50% to 75% of a light emission amount at room temperature. In contrast, the crystal of Example 9 had less reduction in light emission amount even under a high-temperature environment and is thus extremely useful in resource exploration or the like.

When the crystal material according to the present invention is used as a scintillator for PET or the like, in which an intrinsic background does not come into play, Lu may be used in place of La or Ce in the composition of the crystal material according to the present invention.

Figure 15:
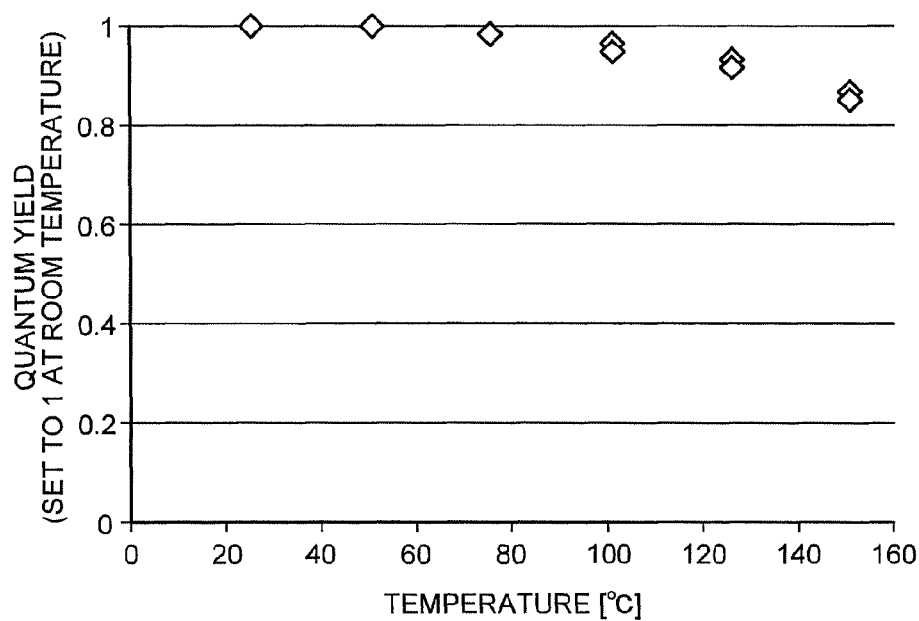
FIG. 15 is a diagram illustrating the temperature dependence of a quantum yield of the crystal of Example 1.

FIG. 15 is a diagram illustrating the temperature dependence of a quantum yield of the crystal of Example 1. In FIG. 15, the horizontal axis shows temperature (centigrade), whereas the vertical axis shows normalized quantum yield with the quantum yield at room temperature (25° C.) as 1. It was revealed that the crystal of Example 1 had a reduction rate of the quantum yield of less than 20% even at 150° C. compared with that at room temperature.

Figure 16:
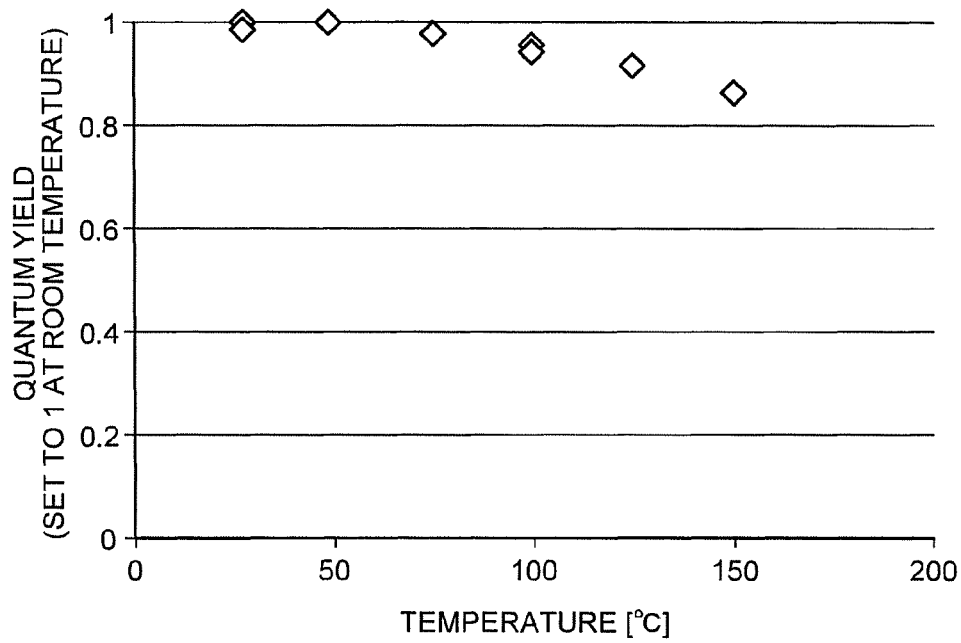
FIG. 16 is a diagram illustrating the temperature dependence of a quantum yield of a crystal of Example 8.

FIG. 16 is a diagram illustrating the temperature dependence of a quantum yield of the crystal of Example 8. In FIG. 16, the horizontal axis shows temperature (centigrade), whereas the vertical axis shows normalized quantum yield with the quantum yield at room temperature (25° C.) as 1. It was revealed that the crystal of Example 8 had a reduction rate of the quantum yield of less than 20% even at 150° C. compared with that at room temperature.

The quantum yield is a ratio of the number of photons emitted to the number of photons when an excitation light beam is incident at an excitation wavelength. The fact that the reduction in quantum yield is less than 20% even at 150° C. compared with that at room temperature indicates that the reduction in light emission amount is suppressed to some extent even in light emission that is not accompanied by ionization action.

Figure 21:
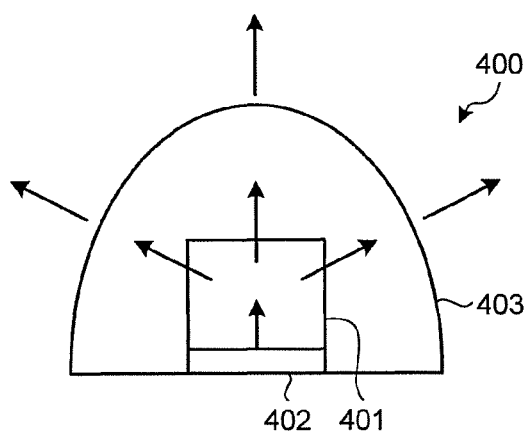
FIG. 21 is a diagram illustrating a lighting apparatus according to an embodiment of the present invention.

Lighting apparatuses such as white light-emitting diodes have the problem that upon starting light emission the temperature of a light-emitting part reaches a high temperature of 100° C. or more, and a light emission amount decreases by 30% or more. A light-emitting body formed of a crystal material by the application of the present invention has less reduction in quantum yield even when the temperature of the light-emitting part reaches a high temperature and is thus suitable for the application to lighting apparatuses or the like. As illustrated in FIG. 21, for example, a lighting apparatus 400 according to an embodiment of the present invention causes an excitation light beam to be incident on a crystal material 401 according to the present invention from a radiation source 402 and uses fluorescence emitted from the crystal material 401 as light for lighting. A cover 403 of the lighting apparatus 400 may be coated with a fluorescent substance or formed of a wavelength-limiting filter to adjust the color tone of the fluorescence emitted from the crystal material 401. The light-emitting body formed of the crystal material by the application of the present invention is not limited to light emission that is accompanied by ionization action.

The present invention is not limited by the above-described embodiments. Any configuration obtained from appropriate combinations of the above-described components is also included in the present invention. Further effects and modifications can be easily derived by those skilled in the art. Wider embodiments of the present invention are therefore not limited to the above-described embodiments and can be changed in a variety of manners.

INDUSTRIAL APPLICABILITY

As described above, the crystal material according to the present invention is useful for radiation detectors, imaging apparatuses, nondestructive inspection apparatuses, and lighting apparatuses.

The invention claimed is:

1. A crystal material represented by a general formula (1):

$$(Gd_{1-x-y-z}La_xME_yRE_z)_2MM_2O_7 \quad (1)$$

where ME is at least one selected from Y, Sc, and Lu; RE is at least one selected from Ce or Pr; MM includes at least Si and Ge; and ranges of x, y, and z are represented by the following (i):

(i) $0.0 \leq x+y+z<1.0$, $0.05 \leq x+z<1.0$, $0.0 \leq y<1.0$, and $0.0001 \leq z<0.05$ (where, when RE is Ce, y=0 is an exception).

2. The crystal material according to claim 1, wherein the ranges of x, y, and z are further represented by, in (i), $0.0 \leq x+y+z \leq 0.5$, $0.07 \leq x+z \leq 0.6$, $0.0 \leq y \leq 0.7$, and $0.002 \leq z \leq 0.02$ (where, when RE is Ce, y=0 is an exception).

3. The crystal material according to claim 1, wherein the ranges of x, y, and z are further represented by, in (i), $0.10 \leq x+z \leq 0.47$, $0.00 \leq y \leq 0.53$, and $0.003 \leq z \leq 0.015$ (where, when RE is Ce, y=0 is an exception).

4. The crystal material according to claim 1, wherein the crystal material emits fluorescence through irradiation with high-energy photons or particles of 2 eV or more, with a certain fluorescent component contained in the fluorescence having a fluorescence lifetime of 1,000 nanoseconds or less and a peak fluorescence wavelength of 250 nm or more and 900 nm or less.

5. The crystal material according to claim 4, wherein, with a light emission amount of the fluorescent component when an environmental temperature is 0° C. as a reference, a reduction rate of the light emission amount of the fluorescent component in an environmental temperature range of from room temperature to 150° C. from the reference is less than 20%.

6. The crystal material according to claim 1, wherein the crystal material emits fluorescence through irradiation with high-energy photons or particles of 2 eV or more, with a certain fluorescent component contained in the fluorescence having a fluorescence lifetime of 80 nanoseconds or less and a peak fluorescence wavelength of 300 nm or more and 700 nm or less.

7. The crystal material according to claim 1, wherein the crystal material emits fluorescence through irradiation with high-energy photons or particles of 2 eV or more, with a certain fluorescent component contained in the fluorescence having a fluorescence lifetime of 60 nanoseconds or less and a peak fluorescence wavelength of 320 nm or more and 700 nm or less.

8. A radiation detector comprising:
   a scintillator that comprises the crystal material according to claim 1; and
   a photodetector that receives fluorescence from the scintillator.

9. An imaging apparatus comprising the radiation detector according to claim 8.

10. A nondestructive inspection apparatus comprising the radiation detector according to claim 8.

11. A radiation detector comprising:
    a scintillator that comprises the crystal material according to claim 1;
    a wavelength conversion element that receives fluorescence from the scintillator and converts wavelengths of light with wavelengths of from 260 nm to 350 nm contained in the fluorescence into any wavelength within a range of from 320 nm to 700 nm; and
    a photodetector that receives light wavelength-converted by the wavelength conversion element.

12. A radiation detector comprising:
    a scintillator that comprises the crystal material according to claim 1; and
    a photodetector that operates at an environmental temperature of room temperature or more and 200° C. or less and receives fluorescence from the scintillator.

13. A lighting apparatus comprising a light-emitting body that comprises the crystal material according to claim 1.

* * * * *